US00RE40486E

(19) United States
(12) Reissued Patent
Lojek et al.

(10) Patent Number: US RE40,486 E
(45) Date of Reissued Patent: Sep. 9, 2008

(54) SELF-ALIGNED NON-VOLATILE MEMORY CELL

(75) Inventors: Bohumil Lojek, Colorado Springs, CO (US); Alan L. Renninger, Cupertino, CA (US)

(73) Assignee: Atmel Corporation, San Jose, CA (US)

(21) Appl. No.: 11/176,883

(22) Filed: Jul. 7, 2005

Related U.S. Patent Documents

Reissue of:
(64) Patent No.: 6,841,823
Issued: Jan. 11, 2005
Appl. No.: 10/001,557
Filed: Oct. 24, 2001

U.S. Applications:
(62) Division of application No. 09/727,571, filed on Nov. 30, 2000, now Pat. No. 6,479,351.

(51) Int. Cl.
*H01L 29/788* (2006.01)
*H01L 29/76* (2006.01)
*H01L 29/94* (2006.01)
*H01L 31/062* (2006.01)
*H01L 31/113* (2006.01)

(52) U.S. Cl. ..... 257/316; 257/317; 257/318; 257/319; 257/320; 257/321; 257/322; 257/327; 257/336; 257/344; 257/408; 257/900; 257/314; 257/315

(58) Field of Classification Search ..... 257/316–322, 257/327–346, 408, 900, 314–315; 438/257, 438/264, 266–267, 304
See application file for complete search history.

(56) References Cited

U.S. PATENT DOCUMENTS 4,833,096 A 5/1989 Huang et al. ..... 437/29
5,021,848 A 6/1991 Chiu ..... 357/23.5
5,087,584 A 2/1992 Wada et al. ..... 437/43
5,108,939 A 4/1992 Manley et al. ..... 437/43
5,268,585 A 12/1993 Yamauchi ..... 257/316
5,338,952 A * 8/1994 Yamauchi ..... 365/185.15
5,402,374 A * 3/1995 Tsuruta et al. ..... 365/185.06
5,477,068 A 12/1995 Ozawa ..... 257/214
5,479,368 A * 12/1995 Keshtbod ..... 365/185.3
5,544,103 A 8/1996 Lambertson ..... 365/185.15
5,614,747 A * 3/1997 Ahn et al. ..... 257/316
5,616,941 A * 4/1997 Roth et al. ..... 257/315
5,618,742 A 4/1997 Shone et al. ..... 438/263
5,703,388 A 12/1997 Wang et al. ..... 257/315
5,776,787 A 7/1998 Keshtbod ..... 437/43
5,786,612 A 7/1998 Otani et al. ..... 257/316
5,789,297 A 8/1998 Wang et al. ..... 438/267
5,793,079 A * 8/1998 Georgescu et al. ..... 257/316
5,918,124 A 6/1999 Sung ..... 438/258
5,963,806 A 10/1999 Sung et al. ..... 438/266
5,972,752 A 10/1999 Hong ..... 438/264

(Continued)

FOREIGN PATENT DOCUMENTS

JP 11-154712 6/1999
JP 11-186416 7/1999

*Primary Examiner*—Ida M. Soward
(74) *Attorney, Agent, or Firm*—Schneck & Schneck; Thomas Schneck

(57) ABSTRACT

Disclosed is a self-aligned non-volatile memory cell including a small sidewall spacer electrically coupled and being located next to a main floating gate region. Both the small sidewall spacer and the main floating gate region are formed on a substrate and both form the floating gate of the non-volatile memory cell. Both are isolated electrically from the substrate by an oxide layer which is thinner between the small sidewall spacer and the substrate; and is thicker between the main floating gate region and the substrate. The small sidewall spacer can be made small; therefore, the thin oxide layer area can also be made small to create a small pathway for electrons to tunnel into the floating gate.

6 Claims, 5 Drawing Sheets

U.S. PATENT DOCUMENTS 6,031,264 A * 2/2000 Chien et al. ..... 257/315
6,043,530 A 3/2000 Chang ..... 257/320
6,060,766 A 5/2000 Mehta et al. ..... 257/369
6,074,914 A 6/2000 Ogura ..... 438/257
6,091,101 A 7/2000 Wang ..... 257/315
6,124,170 A 9/2000 Lim et al. ..... 438/267
6,159,797 A * 12/2000 Lee ..... 438/257
6,160,287 A * 12/2000 Chang ..... 257/321
6,207,507 B1 3/2001 Wang ..... 438/267
6,229,176 B1 * 5/2001 Hsieh et al. ..... 257/316
6,255,691 B1 7/2001 Hashimoto ..... 257/321
6,392,267 B1 * 5/2002 Shrivastava et al. ..... 257/316
6,465,835 B1 * 10/2002 Pham et al. ..... 257/315
6,476,440 B1 * 11/2002 Shin ..... 257/320
6,563,166 B1 * 5/2003 Ni ..... 257/316
2002/0000605 A1 * 1/2002 Liu et al. ..... 257/316

* cited by examiner

SELF-ALIGNED NON-VOLATILE MEMORY CELL

Matter enclosed in heavy brackets [ ] appears in the original patent but forms no part of this reissue specification; matter printed in italics indicates the additions made by reissue.

CROSS-REFERENCE TO RELATED APPLICATION

This is a divisional of patent application Ser. No. 09/727,571 filed Nov. 30, 2000 now U.S. Pat. No. 6,479,351.

TECHNICAL FIELD

The invention relates to self-aligned non-volatile memory cells, and more particularly to a self-aligned non-volatile memory cell that has a high capacitive coupling ratio and has a thin and small tunneling oxide region.

BACKGROUND ART

FIG. 1 shows a sectional view of an EEPROM 100 (Electrically Erasable Programmable Read Only Memory) as depicted in FIG. 18 of U.S. Pat. No. 4,833,096 which is assigned to the same assignee as the present invention. With reference to FIG. 1 of the present application, a deep n-well 23 is formed inside a p-type substrate 40, and N-channel and memory cell devices are defined. N-channel stages and field oxide are formed around the device areas. Channel stops and field oxide are formed by thermally growing a thin oxide layer, depositing a 1000–2500 Å thick nitride layer and removing the nitride from non-device areas, implanting boron ions around the N-well and N-channel device areas, then driving in the boron and thermally growing oxide in the non-device areas not covered by nitride.

The process continues by implanting a first species of N-type impurity in a portion of the memory cell device area, thermally growing a first oxide layer 59, defining a window therein over the impurity implant, implanting a second species of N-type impurity into the window hole, and regrowing a thick oxide layer in the window. Next, a 2500–3400 Å thick polycrystalline silicon ("polysilicon") layer is deposited, and removed with the first oxide layer to form the floating gate 71. A second oxide layer is thermally grown at a temperature of 1000°–1050° C. which ensures that this second oxide layer has a substantially uniform thickness over both the polysilicon floating gate and the substrate. After adjusting the threshold of any enhancement devices, a second gate layer, of either polysilicon or a polysilicon/silicide sandwich, is deposited and selectively removed with the second oxide layer to define gates 95 and 97 for peripheral devices, as well as a second polysilicon gate 99 that, along with floating gate 71, forms a memory cell 30. Sources 105 and drains 107 are then formed using the polysilicon gates of the particular device as a self-aligning mask.

The process concludes by defining a double layer of conductive lines in the following manner. First, a boron/phosphorus-doped silica glass 121 covering is applied, contact holes 123 are etched, and the glass is heated to its flow temperature to round the corners of the contact holes. A first layer of conductive lines 131 is then defined. An insulative intermetal layer 133 is deposited, etched back and redeposited to form a substantially planar surface. Via holes 135 are wet/dry etched and the second layer of conductive lines 137 is then defined. A passivation layer 139 can be deposited over the second metal layer 137, or for single metal layer devices, over the first metal layer 131.

EEPROM 100 can program/erase faster if its coupling ratio can be made higher. Coupling ratio of memory cell 30 (and also of EEPROM 100) is the ratio of a first capacitance (not shown) formed between control gate 99 and floating gate 71 of cell 30 over a second capacitance (not shown) formed between floating gate 71 and p-substrate 40 of cell 30. The first and second capacitances are in series; therefore, when the coupling ratio of memory cell 30 increases, with other factors being the same, the voltage drop between floating gate 71 and p-substrate 40 of cell 30 also increases. As a result, it is easier for electrons to tunnel through thin tunnel oxide layer 59 into floating gate 71. In other words, programming cell 30 becomes faster.

There are at least two methods to increase the coupling ratio of memory cell 30. A first method is to increase the first capacitance formed between control gate 99 and floating gate 71 of cell 30. One way to do this is to increase the overlapping area between control gate 99 and floating gate 71 of cell 30.

A second method is to decrease the second capacitance formed between floating gate 71 and p-substrate 40 of cell 30. This can be done by reducing the overlapping area between floating gate 71 and p-substrate 40 of cell 30. It should be noted that although increasing the thickness of a dedicated tunnel oxide region 59 between floating gate 71 and p-substrate 40 of cell 30 would decrease the second capacitance and hence increase the coupling ratio, that would also make it much harder for electrons to tunnel through the tunnel oxide region 59. Therefore, as a compromise, the dedicated tunnel oxide layer 59 should be thinner at only a small portion of the tunnel oxide region 130 to serve as a pathway for electrons to tunnel from p-substrate 40 into floating gate 71 and should be thicker at the rest of tunnel oxide region 59.

However, there is still room for improvement using the second method mentioned above. It is the object of the present invention to improve upon the prior art method of decreasing the second capacitance formed between the floating gate and the p-well or p-substrate, by providing a method of forming a memory cell in which the tunnel oxide region is thinner at a small portion in order to create a pathway for electrons to tunnel into the floating gate, while having the tunnel oxide region remain thicker at other places.

SUMMARY OF THE INVENTION

The non-volatile memory cell of the present invention has a small sidewall spacer electrically coupled and being located next to a main floating gate region. Both the small sidewall spacer and the main floating gate region are formed on a substrate and both form the floating gate of the non-volatile memory cell. Both are isolated electrically from the substrate by an oxide layer which is thinner between the small sidewall spacer and the substrate; and is thicker between the main floating gate region and the substrate. The small sidewall spacer can be made narrow; therefore, the thin portion of the oxide layer can also be made small to create a small pathway for electrons to tunnel into the floating gate.

BEST MODE FOR CARRYING OUT THE INVENTION

Figure 1:
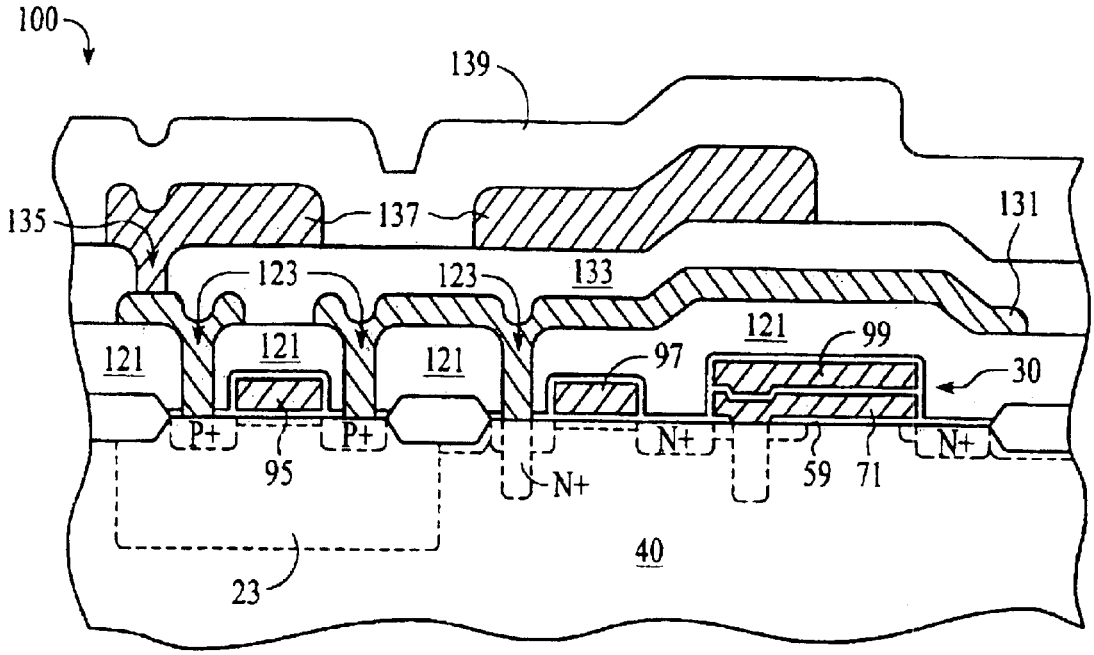
FIG. 1 (PRIOR ART)
FIG. 1 is a sectional view of a typical EEPROM (Electrically Erasable Programmable Read Only Memory) of prior art.
Figure 2A:
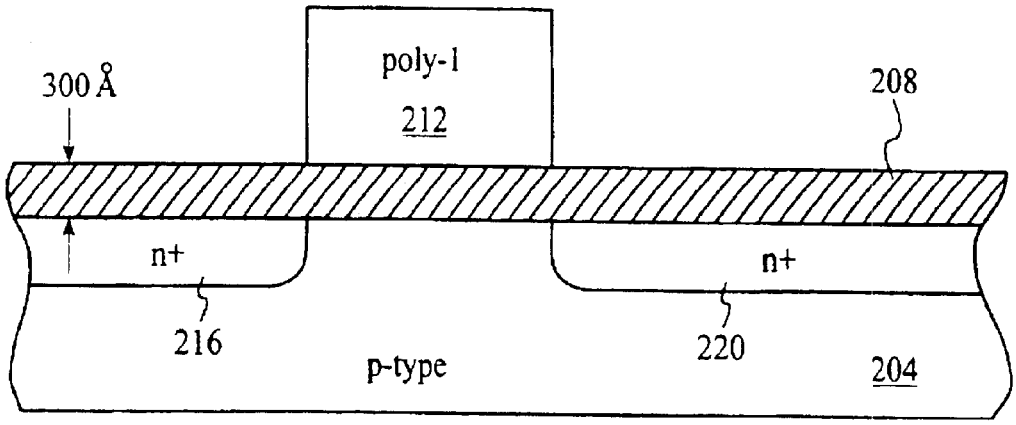
FIGS. 2A–2H illustrate the steps in manufacturing the self-aligned non-volatile memory cell of the present invention.
Figure 2B:
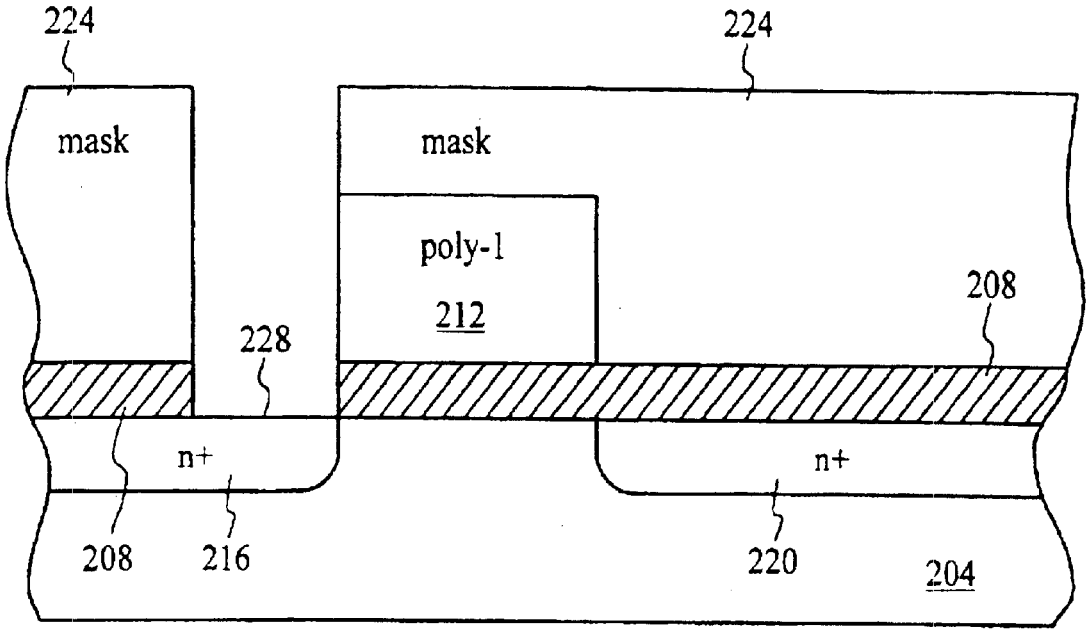
Figure 2C:
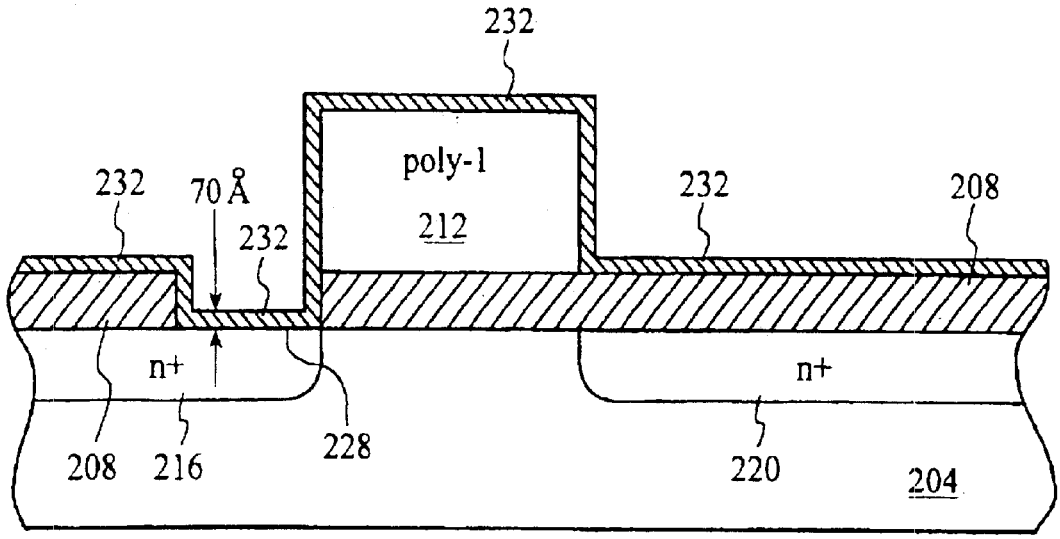
Figure 2D:
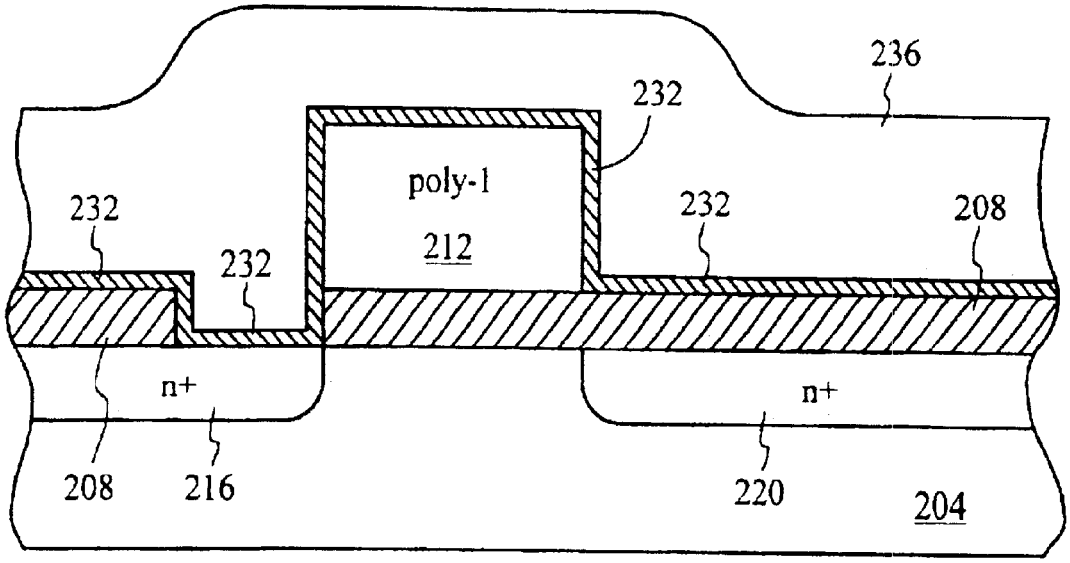
Figure 2E:
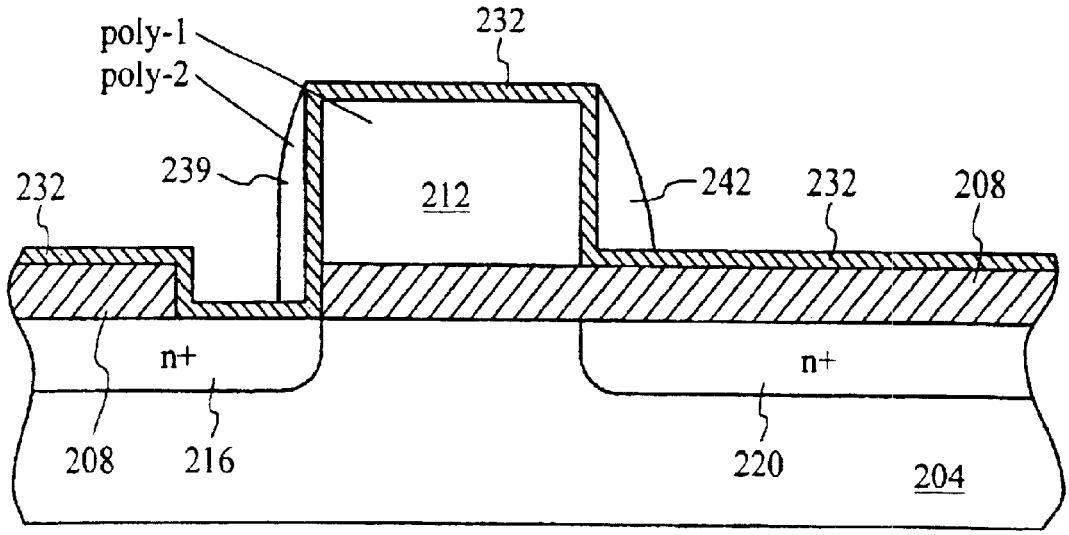
Figure 2F:
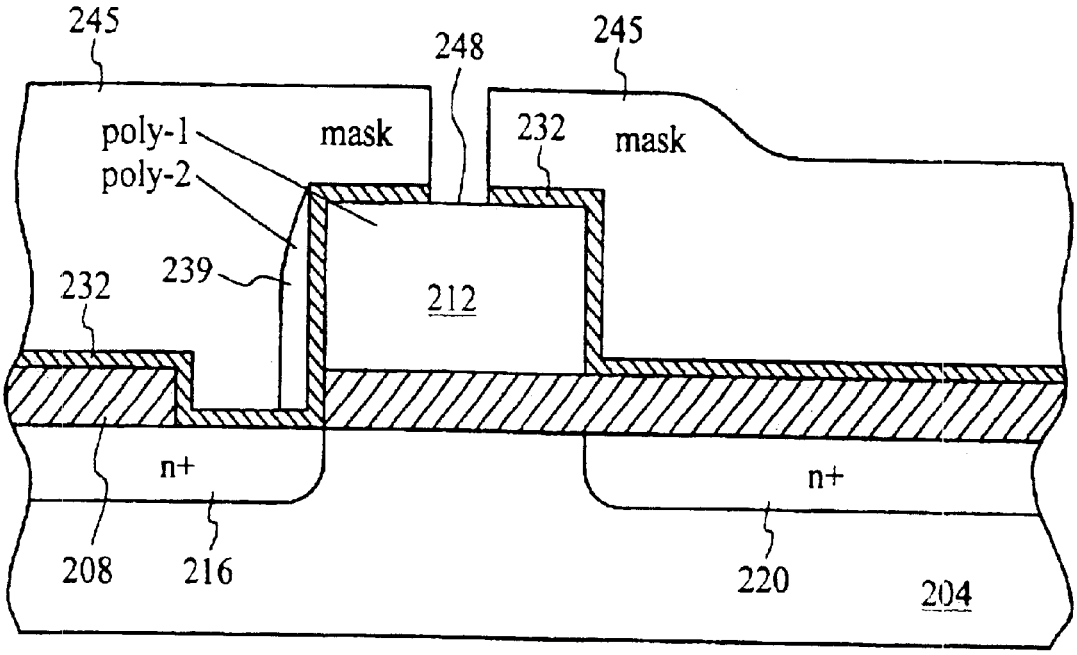
Figure 2G:
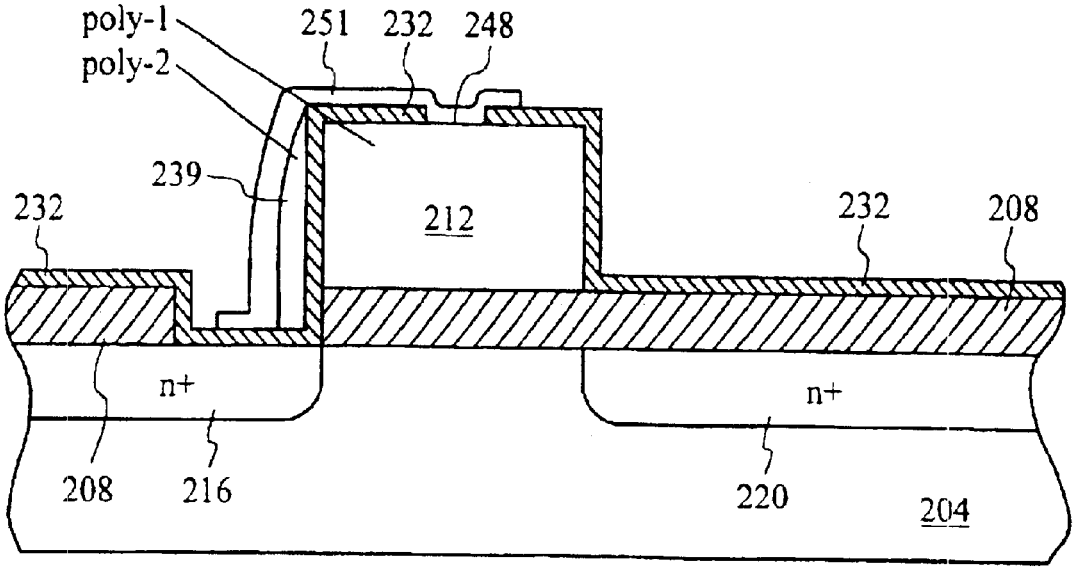
Figure 2H:
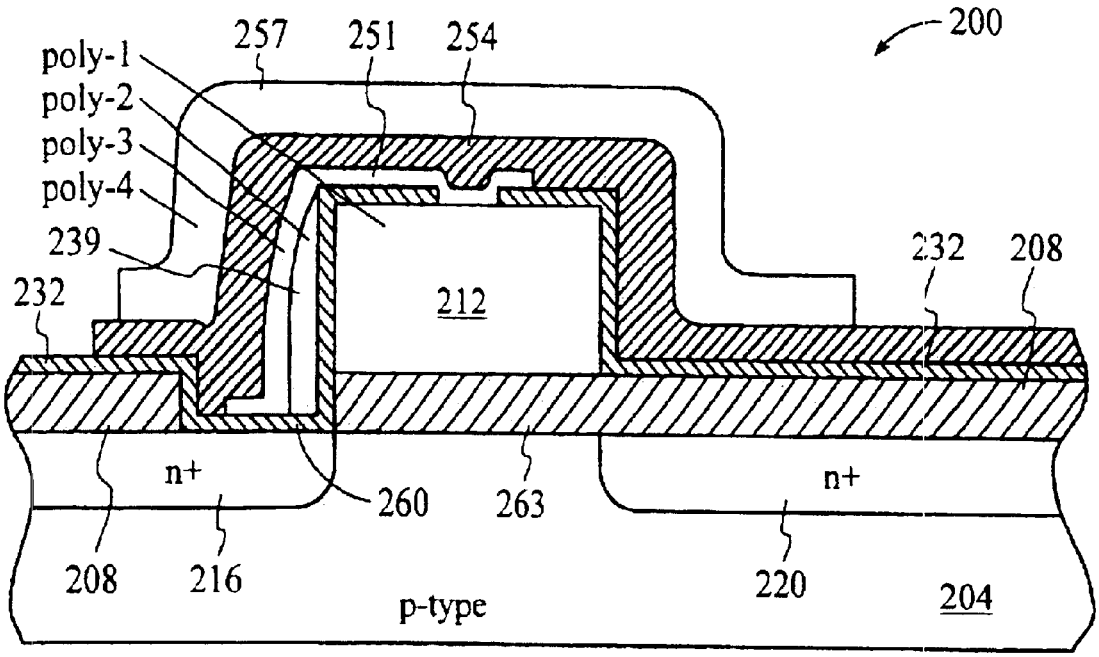

The final structure and operation of a non-volatile memory cell 200 of the present invention, as shown in FIG. 2H, can be well understood by going through the steps for fabricating the same. With reference to FIG. 2A, the fabrication process of the non-volatile memory cell of the present invention starts with, for illustrative purposes, a p-type semiconductor substrate 204. A silicon oxide (SiO2) layer 208, about 300 Angstroms (1 Å=$10^{-10}$m) thick, is formed on substrate 204. In the next step, a first polysilicon (poly-1) layer 212 is deposited upon silicon oxide layer 208. Then, excessive portion of poly-1 layer 212 is etched away leaving only poly-1 region 212 as seen in FIG. 2A, which later serves as part of a floating gate 212, 239, 251 of memory cell 200 in FIG. 2H. In the next step, n+ regions 216 and 220 are implanted by ion bombardments using poly-1 region 212 as a mask. In other words, n+ regions 216 and 220 are self-aligned with the two opposing sides of poly-1 region 212.

With reference to FIG. 2B, photoresist masks 224 are used in wet-etching away a portion of silicon oxide layer 208 to expose surface 228 of n+ region 216. Then, masks 224 are removed.

With reference to FIG. 2C, a thin silicon oxide layer 232, about 70 Å thick, is formed upon the structure, and covers completely the structure, including surface 228.

With reference to FIG. 2D, a second polysilicon (poly-2) layer 236 is deposited to blanket thin silicon oxide layer 232. Poly-2 layer 236 is then dry-etched away leaving only poly-2 sidewall spacers 239 and 242 to the left and right of poly-1 region 212, respectively, as seen in FIG. 2E. The etching operation can be carried out using an anisotropic etching method. Poly-2 sidewall spacer 242 to the right of poly-1 region 212 is not critical to the present invention, and therefore is not discussed in great detail in the following discussion. At this time, poly-2 sidewall spacer 239 and poly-1 region 212 are electrically separated by thin silicon oxide layer 232.

With reference to FIG. 2F, photoresist masks 245 are used in wet-etching away a portion of thin silicon oxide layer 232 to expose a surface 248 on top of poly-1 region 212. Then, masks 245 are removed.

With reference to FIG. 2G, a third polysilicon (poly-3) layer 251 is deposited to blanket the entire structure. This thin poly-3 layer 251 has electrical contact with poly-1 region 212 via surface 248. Poly-3 layer 251 also has direct contact with poly-2 sidewall spacer 239. The excessive portion of poly-3 layer 251 is then dry-etched away leaving only the necessary portion 251 as seen in FIG. 2G.

With reference to FIG. 2H, an insulating ONO (Oxide/Nitride/Oxide) layer 254 is deposited to blanket the structure. Then, masks are used to remove the excessive portion of insulating ONO layer 254 to the left. In the next step, a fourth polysilicon (poly-4) layer 257 is deposited to blanket the entire structure. Then, masks are used to remove excessive portion on both sides of the poly-4 layer 257 as seen in FIG. 2H. The structure of insulating ONO layer 254 and poly-4 layer 257 and the method of fabricating the same are well known in the art, and therefore are not discussed in detail here.

The final structure is a non-volatile memory cell 200. Poly-1 region 212, poly-2 sidewall spacer 239, and poly-3 layer 251 form a floating gate 212, 239, 251 of memory cell 200. Poly-4 layer 257 forms a control gate 257 of memory cell 200. Floating gate 212, 239, 251 and control gate 257, separated from each other by insulating ONO layer 254 form a first parallel-plate capacitor (not shown). Floating gate 212, 239, 251 and substrate 204 forms a second parallel-plate capacitor (not shown). The first and second parallel-plate capacitors are in series. The insulating layer between the two parallel plates of the second parallel-plate capacitor has two insulating portions. A first insulating portion 260 is thin and is part of thin silicon oxide layer 232. First insulating portion 260 extends from the leftmost edge of poly-3 layer 251 to the rightmost edge of poly-2 sidewall spacer 239. A second insulating portion 263 is thicker and is part of silicon oxide layer 208 that lies under poly-1 region 212.

At a first look, both insulating portions 260 and 263 should be thick to keep low the capacitance of the second parallel-plate capacitor so as to keep high the coupling ratio of cell 200. However, such a high coupling ratio would not make programming the cell easier because although most of voltage difference between control gate 257 and drain 216 would appear between floating gate 212, 239, 251 and drain 216 due to the high coupling ratio, it would still be difficult for electrons to tunnel through the thick insulating portions 260 and 263. Memory cell 200 of the present invention solves this problem by making insulating portion 260 thin and small. As a result, insulating portion 260 becomes a pathway (or tunneling oxide region) for electrons to tunnel from drain 216 into poly-2 sidewall spacer 239 which is part of floating gate 212, 239, 251 to program memory cell 200. Making insulating portion 260 thin increases the capacitance of the second parallel-plate capacitor. However, because insulating portion 260 is small in area compared with insulating portion 263, the increase of capacitance of the second parallel-plate capacitor is much less that if both insulating portions 260 & 263 are made thin to let electrons to tunnel into floating gate 212, 239, 251. As a result, this makes it easier for electrons to tunnel from drain 216 through thin insulating portion 260 into poly-2 sidewall spacer 239 which is part of floating gate 212, 239, 251 so as to program memory cell 200.

Programming memory cell 200 can be done by applying a high voltage (e.g., 12 V–15 V) to control gate 257, a ground potential to drain 216 and source 220. Electrons will tunnel through thin insulating portion 260 into poly-2 sidewall spacer 239 which is part of floating gate 212, 239, 251 under Fowler-Nordheim tunneling effect. The electrons trapped in floating gate 212, 239, 251 increases the threshold voltage of memory cell 200 such that there is no conducting channel between drain 216 and source 220 in read mode. In other words, a programmed cell 200 represents a logic 0.

An unprogrammed cell 200 having no trapped electrons in its floating gate 212, 239, 251 has a normal threshold voltage. In read mode, for an unprogrammed cell 200, a conducting channel forms under insulating portion 263 between drain 216 and source 220. In other words, an unprogrammed cell 200 represents a logic 1. During read mode, the voltage applying to control gate 257 of memory cell 200 with respect to source 220 must be higher than that normal threshold voltage of an unprogrammed cell but must be lower than the increased threshold voltage of a programmed cell. As a result, during read mode, selected programmed cells 200 do not conduct and selected unprogrammed cells 200 conducts.

Erasing a programmed memory cell 200 can be done by applying a high voltage (e.g., 12 V) to drain 216, a ground potential to both control gate 257 and source 220. Trapped electrons in floating gate 212, 239, 251 tunnels through thin insulating portion 260 to drain 216. Thereby, the cell becomes unprogrammed.

Figure 3:
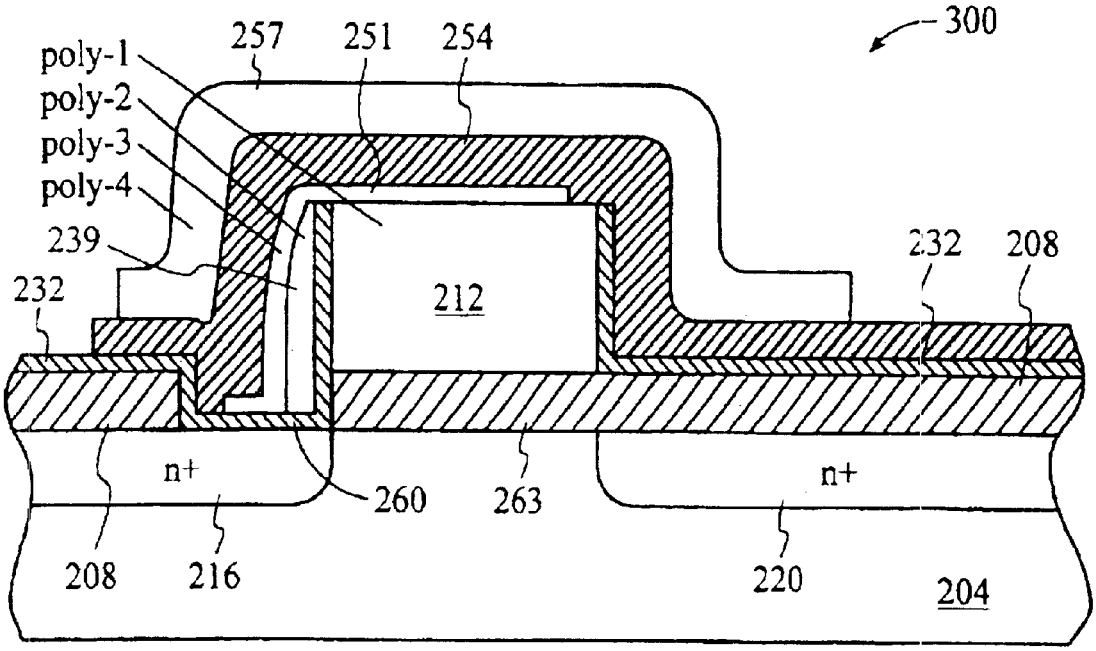
FIG. 3 is another preferred embodiment of the non-volatile memory cell of the present invention.

With reference to FIG. 3, another embodiment is shown in which memory cell 300 is the same as memory cell 200 of FIG. 2H, except that thin silicon oxide layer 232 is removed completely from the top of poly-1 region 212 by using a chemical-mechanical polishing (CMP) process to expose surface 248 of poly-1 region 212. After that, poly-3 layer 251, insulating ONO layer 254, and poly-4 layer 257 are in turn formed on the structure as in the case of memory cell 200 of FIG. 2H.

The non-volatile memory cell of the present invention also comprises a select transistor which is well known in the art and therefore is not discussed in here.

What is claimed is:

1. A non-volatile memory cell comprising:

a semiconductor substrate, with a drain and a source in the substrate;

a conductive floating gate formed on the substrate between the source and drain with a first insulating layer separating said floating gate from said substrate, said floating gate including a main floating gate region and a small sidewall spacer, said first insulating layer including a first insulating portion separating said small sidewall spacer from the substrate and from the main floating gate region, [said] *a* second insulating portion separating said main floating gate region from said substrate, wherein the first insulating portion is thin tunnel oxide that is thinner than said second insulating portion, said small sidewall spacer having a first side contacting the thin tunnel oxide insulation and an opposite side that is electrically couple to the main floating gate region by a conductive connecting layer extending over said opposite side of the sidewall spacer and extending past the thin tunnel oxide to contact the main floating gate region;

a control gate formed over the floating gate; and a second insulating layer separating said control gate and said floating gate.

2. The non-volatile memory cell of claim 1 wherein said connecting conductive layer extends along a side of said main floating gate region, the thin tunnel oxide insulation having a portion covering the main floating gate region except for an opening therein, with the connecting conductive layer making contact with the main floating gate region through said opening.

3. The non-volatile memory cell of claim 1 wherein said connecting conductive layer extends along a side of the small sidewall spacer and on top of said main floating gate region.

4. The non-volatile memory cell of claim 1, wherein said first insulating portion is over said drain.

5. The non-volatile memory cell of claim 4 wherein said first insulating portion extends continuously across the memory cell.

6. The non-volatile memory cell of claim 4 wherein said drain and source are self-aligned with the opposing sides of said main floating gate region.

* * * * *

UNITED STATES PATENT AND TRADEMARK OFFICE

CERTIFICATE OF CORRECTION

PATENT NO. : RE 40,486 E
APPLICATION NO. : 11/176883
DATED : September 9, 2008
INVENTOR(S) : Lojek et al.

It is certified that error appears in the above-identified patent and that said Letters Patent is hereby corrected as shown below:

In column 3, line 12, delete "SiO2" and insert -- $SiO_2$ --, therefor.

In column 3, line 13, delete "Angstroms" and insert -- Angstrom --, therefor.

In column 4, line 33, after "much less" delete "that" and insert -- than --, therefor.

In column 4, line 57, after "higher than" delete "that" and insert -- the --, therefor.

In column 5, line 29, in Claim 1, before "insulation" delete "oxide".

In column 5, line 30, in Claim 1, after "electrically" delete "couple" and insert -- coupled --, therefor.

Signed and Sealed this

Sixteenth Day of December, 2008

JON W. DUDAS
*Director of the United States Patent and Trademark Office*